United States Patent [19]
Rao

[11] Patent Number: 5,600,606
[45] Date of Patent: Feb. 4, 1997

[54] LOW PIN COUNT - WIDE MEMORY DEVICES USING NON-MULTIPLEXED ADDRESSING AND SYSTEMS AND METHODS USING THE SAME

[75] Inventor: G. R. Mohan Rao, Dallas, Tex.

[73] Assignee: Cirrus Logic, Inc., Fremont, Calif.

[21] Appl. No.: 612,113

[22] Filed: Mar. 7, 1996

Related U.S. Application Data

[63] Continuation-in-part of Ser. No. 521,867, Aug. 31, 1995, Pat. No. 5,537,353.

[51] Int. Cl.$^6$ ................... G11C 7/00; G11C 8/00
[52] U.S. Cl. ................ 365/233; 365/189.05; 365/193; 365/230.08; 365/238.5
[58] Field of Search .................. 365/233, 189.05, 365/193, 230.08, 238.5

[56] References Cited

U.S. PATENT DOCUMENTS

| | | | |
|---|---|---|---|
| 4,435,792 | 3/1984 | Bechtolsheim | 365/230.02 |
| 4,660,181 | 4/1987 | Saito et al. | 365/230.02 |
| 4,958,322 | 9/1990 | Kosugi et al. | 365/189.02 |
| 5,109,360 | 4/1992 | Inazumi et al. | 365/230.02 |
| 5,249,160 | 9/1993 | Wu et al. | 395/164 |
| 5,319,755 | 6/1994 | Farmwald et al. | 395/325 |
| 5,343,438 | 8/1994 | Choi et al. | 365/233 |
| 5,408,129 | 4/1995 | Farmwald et al. | 257/692 |
| 5,430,676 | 7/1995 | Ware et al. | 365/189.02 |
| 5,432,747 | 7/1995 | Fuller et al. | 365/233 |
| 5,434,817 | 7/1995 | Ware et al. | 365/189.01 |
| 5,450,542 | 9/1995 | Lehman et al. | 395/162 |
| 5,537,353 | 7/1996 | Rao et al. | 365/233 |

*Primary Examiner*—David C. Nelms
*Assistant Examiner*—Trong Quang Phan
*Attorney, Agent, or Firm*—Winstead Sechrest & Minick, P.C.

[57] ABSTRACT

A method of operating a memory device including a plurality of data/address input/output terminals, an array of memory cells and circuitry for accessing selected ones of the memory cells in response to received address bits. At least one row address bit and at least one column address bit are substantially simultaneously input during an address cycle, at least one of the address bits being input through a selected one of the multiplexed terminals. The memory cells addressed by the row and column bits are then accessed through selected ones of the multiplexed terminals during a data access cycle.

23 Claims, 7 Drawing Sheets

LOW PIN COUNT - WIDE MEMORY DEVICES USING NON-MULTIPLEXED ADDRESSING AND SYSTEMS AND METHODS USING THE SAME

CROSS REFERENCE TO RELATED APPLICATIONS

The present application is a continuation-in-art of co-assigned U.S. patent application Ser. No. 08/521,867 (Attorney's Docket No. 2836-P036US), entitled "LOW PIN COUNT—WIDE MEMORY DEVICES AND SYSTEMS AND METHODS USING THE SAME," and filed Aug. 31, 1995 which is now U.S. Pat. No. 5,537,353 issued Jul. 16, 1996.

TECHNICAL FIELD OF THE INVENTION

The present invention relates in general to electronic circuits and devices and in particular to low pin count memory devices using non-multiplexed addressing and systems and methods using the same.

BACKGROUND OF THE INVENTION

Presently, most memory systems in computers are either constructed from static random access memory devices (SRAMs) or dynamic random access memory devices (DRAMs). Each type of memory device has advantages and disadvantages, and as a result DRAMs and SRAMS are typically restricted to different applications. SRAMs are faster and are typically used in applications where fast access times and high bandwidth are critical, such as in cache memories. SRAMs however consume more power, are more expensive to fabricate, and provide fewer cells (bits) per given chip space. On the other hand, while slower than SRAMs, DRAMs are typically less expensive, consume substantially less power, and provide more bits in the same chip space (i.e. have a higher cell density). DRAMs are typically used to construct those memory subsystems, such as system memories and display frame buffers, where power reduction and cell density are more critical than speed. In most computing systems, it is these subsystems which dominate the system architecture, and hence, DRAMs remain the prevalent type of memory device on the market.

In the vast majority of presently available commercial DRAMs, the maximum number of available data input/output pins is 16, allowing access to a maximum of 16 bits per random access (or page) cycle. This presents a problem in the construction of state of the art computing systems, where the data buses are as wide as 64 or 72 bits. For example, to support a 64-bit wide data bus, four parallel "by 16" devices are required per bank of memory. Multiple chips in turn require additional board space, increase power consumption and increase the number of required interconnections on the printed circuit boards. Further, since DRAMs (monolithic) are constructed in fixed sizes, such as 512 Kbytes or 2 Mbytes, memory space is often wasted. For example, depending on whether 512 KByte or 2 MByte devices are used, each system memory bank would have a corresponding capacity of 1 MByte or 4 MBytes respectively (in this case). If only an intermediate capacity is required per bank, such as 3 MBytes, the larger incrementation must be selected and substantial memory space is wasted.

It would be advantageous to construct DRAMs with wider data ports For example, two DRAMs each with 32 data pins or one DRAM with 64 data pins could support a 64-bit bus during a single random access. However, increased pin count almost always increases device cost. In devices such as the CPU, where only a single unit is required per system, the increased cost associated with increased pin count can usually be tolerated. In contrast, such cost increases normally cannot be tolerated in the case of memory devices, since a significant number of memory devices are normally required per system, typically between 10 and 20 in current architectures. The problem of pin count is particularly difficult if a 64-bit wide device is considered. Here, at least 64 data pins and approximately 21 other pins (for addresses, power and control signals) would be required. Currently available packages come in 60 and 100 pin counts, and therefore, in this case, the more expensive 100 pin package would have to be selected, even though a large number of pins would go unused.

Thus, the need has arisen or circuits and methods for implementing wide memory devices. In particular, such circuits and methods should be applicable to DRAM memory devices, although not necessarily limited thereto. In implementing such a wide memory device, pin count should be minimized.

SUMMARY OF THE INVENTION

According to a first embodiment of the present invention, a method is provided for operating a memory device including a plurality of mutliplexed data/address input/output terminals, an array of memory cells, and circuitry for accessing selected ones of the memory cells in response to received address bits. At least, one row address bit and at least one column address bit are input substantially simultaneously during address cycle, with at least one of the address bits being input through a selected one of the multiplexed terminals. The memory cells addressed by the row and column bits are then accessed through selected ones of the multiplexed terminals during a data access cycle.

According to a second embodiment of the present invention, a method is provided for operating a random access memory. During a precharge period, row and column address bits are input substantially simultaneously, at east some of the address bits being input through a plurality of multiplexed data/address input/output terminals. During an active period, a random access is performed through the multiplexed terminals to the memory cells addressed by the input row and column bits.

The principles of the present invention are also embodied in a random access memory. The random access memory includes a plurality of terminals for receiving substantially simultaneously row and column address bits during an address cycle, at least some of the plurality of terminals comprising multiplexed terminals for exchanging data during a data access cycle. The memory further includes an array of rows and columns of memory cells and addressing circuitry for accessing locations within the array in response to received row and column address bits.

According to a further embodiment of the principles of the present invention, a memory system is provided which includes a non-multiplexed address bus, a data bus, and a random access memory. The random access memory includes a plurality of terminals for receiving substantially simultaneously row and column address bins presented on the non-multiplexed address bus during an address cycle, at least some of the plurality of terminals comprising multiplexed terminals for exchanging data with the data bus during a data access cycle. The memory also includes an array of rows and columns of memory cells and addressing circuitry for accessing locations within the array in response to received row address bits, The principles of the present invention provide substantial advantages over the prior art. Among other things, these principles allow for the implementation of wide memory devices and in particular wide dynamic random access memory devices. Such devices in turn allow for the reduction of the number of chips required to support a wide data bus, such as a 62-bit or 72-bit data bus. Further, as a result of the reduction in the number of chips required to support the data bus, wasted memory space can be substantially reduced.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1:
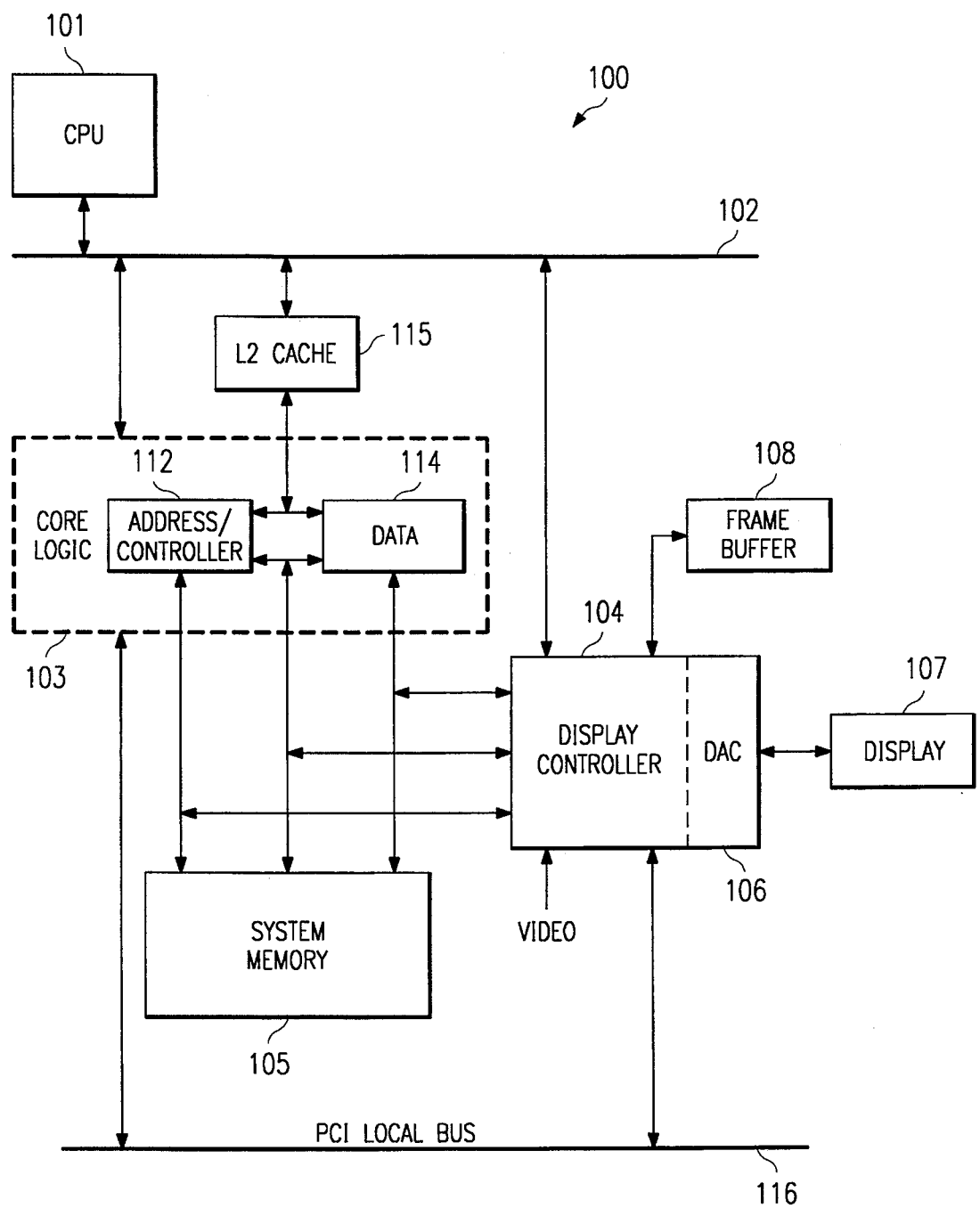
FIG. 1 is a high level functional block diagram of a typical data processing system in which memory devices embodying the principles of the present invention may be used.

FIG. 1 is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address intensive" while one or more core logic chips, such as chip 114 in FIG. 1, are "data intensive." CPU 101 can directly communicate with core logic 103 or through an external (L2) cache 115. L2 cache 115 may be for example a 256 KByte fast SRAM device(s). It should be noted that CPU 101 can also include on-board (L1) cache.

Display controller 104 may be any one of a number of commercially available VGA display controllers. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y- zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select and virtual memory operations. In a Pentium™ processor system, the address portions of CPU bus 102 and PCI bus 116 are typically on the order of 30 bits wide.

Figure 2:
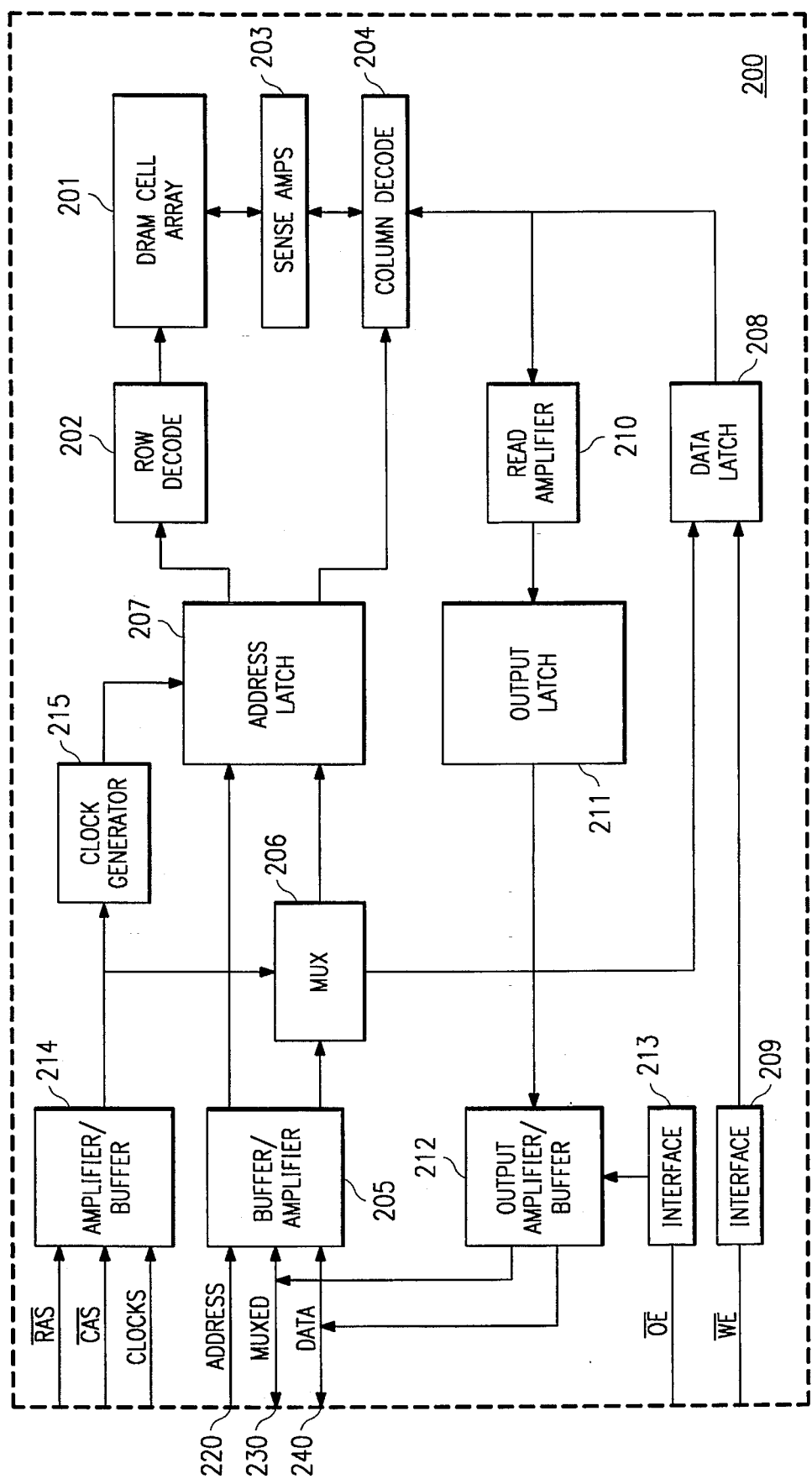
FIG. 2 is a high level functional block diagram of a memory device embodying the principles of the present invention.

FIG. 2 is a functional block diagram of a low pin count-wide memory device 200 embodying the principles of the present invention and constructed as a monolithic integrated circuit. In the preferred embodiment, device 200 is based around a DRAM cell array 201. Cell array 201 is arranged in M number of rows and N number of columns, which may be partitioned into a number of cell arrays. Each row is associated with a conductive rowline (wordline) and each column is associated with at least one conductive bitline. A row select is accomplished through a row decoder 202 which controls the voltage on each of the wordlines in the array in response to received row addresses.

Sense amplifiers 203 are coupled to the bitlines of cell array 201. Preferably, one sense amplifier is included for each of the bitlines, however, the sense amplifiers 203 may also be multiplexed between multiple bitlines in alternate embodiments. A column decoder 204 is coupled to sense amplifier 203 and controls the selection of a given number of column lines (bitlines) during an access. Typically, during an access all sense amplifiers 203 are active and column decoder only gates those which correspond to the bitlines intersecting the cells of the selected location.

In the illustrated embodiment, memory 200 is organized as a "by 64" memory in which column decoder 204 selects 64 bitlines to allow simultaneous access to 64 bits along a selected row (i.e., a 64-bit location) during a random access. In alternate embodiments, memory 200 could be organized as a by 1, by 2, by 4, by 8, by 32 or larger location memory (e.g., by 72-bit). A by 64-bit architecture advantageously allows memory 200 to entirely interface with the buses in a 64-bit system 100.

According to the principles of the present invention, memory 200 includes a selected number of I/O pins 220 which are dedicated for receiving addresses, a second selected number of pins 230 which are multiplexed for either inputting addresses or inputting and outputting data, and a third selected number of pins 240 dedicated for inputting and outputting data. The process of inputting and outputting data and addresses will be further discussed below. However, it should be noted at this point that addresses and data are selectively presented to the multiplexed pins 230 under control of core (glue) logic; conventional core logic 103 of system 100. Generally, conventional core logic chips can bridge the address and data bus and switch a given port in the systems such as multiplexed pins 230, to either the address path or the data path of either CPU bus 102 or PCI local bus 116.

It should be noted that the "frame buffer" can also use the address/data mixing scheme, provided the memory controller embedded in the graphics controller is designed suitably.

It should be noted that while in the illustrated embodiment only some of the address pins are multiplexed, and some are dedicated, in alternative embodiments all the pins receiving addresses may be multiplexed to also receive data. The same is true for those pins receiving data; in alternate embodiments all pins exchanging data may be multiplexed to also receive addresses. In the preferred embodiment, some address pins are dedicated in order to be available to be used for other functions. For example, the pins receiving the high order address bits may be non-multiplexed and also used for bank or byte select operations.

I/O pins 220, 230, 240 are coupled to an input buffer/amplifier 205. Addresses received on a dedicated address pins 220 are coupled to an address latch 207. Addresses received on multiplexed pins 230 are selectively passed to address latch 207 through a multiplexer 206. It should be noted that row and column addresses received at pins 220 and 230 may be word serially received (i.e., row address bits received as a word and column address bits received subsequently as a separate word) from a conventional multiplexed address bus. In this case, address latch may be a conventional 3-phased address latch system which would pipeline the initially received row addresses to row decoder 202 and the subsequently received column addresses to column decoder 204.

During data input (a write operation), data received on multiplexed pins 230 and dedicated data pins 240 are switched by multiplexer 206, in accordance with the timing discussed below, to a data latch 208. During a write, data latch 208 transfers the data being written to column decoder 204 in response to a write enable (WE) control signal received by TTL, CMOS or other I/O standard, interface circuit 209.

During a data read, data output from sense amplifiers 203 and column decoder 204 are passed first to a read amplifier 210 and then to an output latch 211. The data from output latch 211 is then passed through an output amplifier/buffer 212 to multiplexed pins 230 and data pins 240, preferably bypassing input buffer/amplifier 205. Output amplifier/buffer 212 is enabled by an output enable signal ($\overline{OE}$) received by TTL, CMOS or other I/O standard, interface circuitry 213.

The timing and control in the illustrated embodiment of FIG. 2 is based on a row address strobe ($\overline{RAS}$), column address strobe ($\overline{CAS}$) and conventional DRAM control clocks received through an amplifier/buffer 214. In the preferred asynchronous embodiment, $\overline{RAS}$ used to control (switch) multiplexer 206 as discussed below. Alternatively, a multiplexer 206 may be controlled by both the $\overline{RAS}$ and $\overline{CAS}$ signals. A clock generator 215 generates the clocks necessary to pipeline addresses through address latch 207 from the received $\overline{RAS}$, $\overline{CAS}$ and clock signals.

Figure 3:
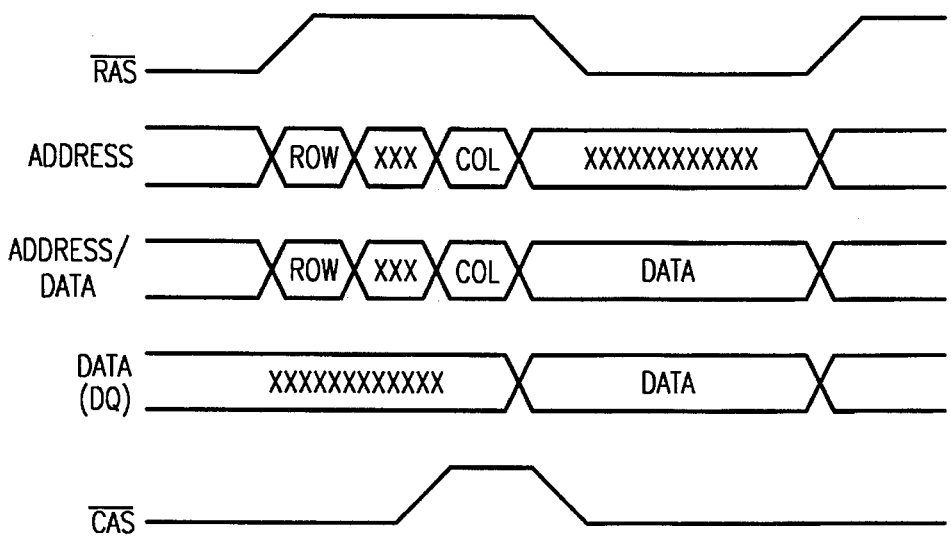
FIG. 3 is a timing diagram depicting one access cycle during a new and nontraditional method of operating the memory device of FIG. 2.

FIG. 3 is a timing diagram illustrating the preferred operation of memory 200 according to the principles of the present invention. During the period when $\overline{RAS}$ is high, memory 200 is in precharge, as is known in the art. Generally, during precharge, various nodes of the dynamic circuitry, of which memory device 200 is preferably constructed, are brought to selected voltages, and most importantly, the sense amplifiers are equalized. According to the present invention, addresses are also received during this period when $\overline{RAS}$ is inactive (high) on both the address dedicated pins 220 and the multiplexed address/data pins 230. Consequently, during $\overline{RAS}$ high, MUX 206 switches to couple multiplexed pins 230 to address latch 207. In the preferred embodiment, row address bits are first received and passed to address latch 207 for pipelining to row decoder 202. After a don't care period, the column address bits presented on pins 230 and 240 are received and pipelined through address latch 207 to column decoder 204. In a non-multiplexed addressing system, row and column bits would be received at once. On the falling edge of $\overline{RAS}$, memory 200 enters an active cycle. Among other things, the sense amplifiers are now prepared to transfer data and all dynamic circuitry which had been shut-down during the inactive cycle to save power are re-activated. During a write to cell array 201, multiplexer 206 switches such that data received at both the multiplexed input pins 230 and the data dedicated pins 205 are coupled to data latch 208 for presentation to column decoder 204, as controlled by the write enable signal. During a read, multiplexer 206 is in a don't care or tri-state (high impedance) condition. The data is then read out through the path comprising sense amps 203, column decoder 204, read amplifier 210, output latch 211 and output amplifier/buffer 212. With the rising edge of $\overline{RAS}$, memory 200 leaves the active state, enters the next inactive cycle and waits for a new set of row and column addresses.

In the preferred embodiment, the input of row and column addresses, even from a multiplexed bus, is performed independent of a column address strobe ($\overline{CAS}$). In alternative embodiments, $\overline{CAS}$ may be used to control the timing and latching in to address latch 207 of the column addresses appearing on address pins 220 and multiplexed pins 230 during each inactive cycle. The timing relationship of $\overline{CAS}$ with the $\overline{RAS}$, addresses and data is also shown in FIG. 3.

The scheme also works equally well, as an alternate embodiment, in a synchronous mode with master clock or in a traditional DRAM timing scheme wherein the row address is strobed on the falling edge as $\overline{RAS}$ and the column address is strobed on the falling edge of $\overline{CAS}$.

Figure 4:
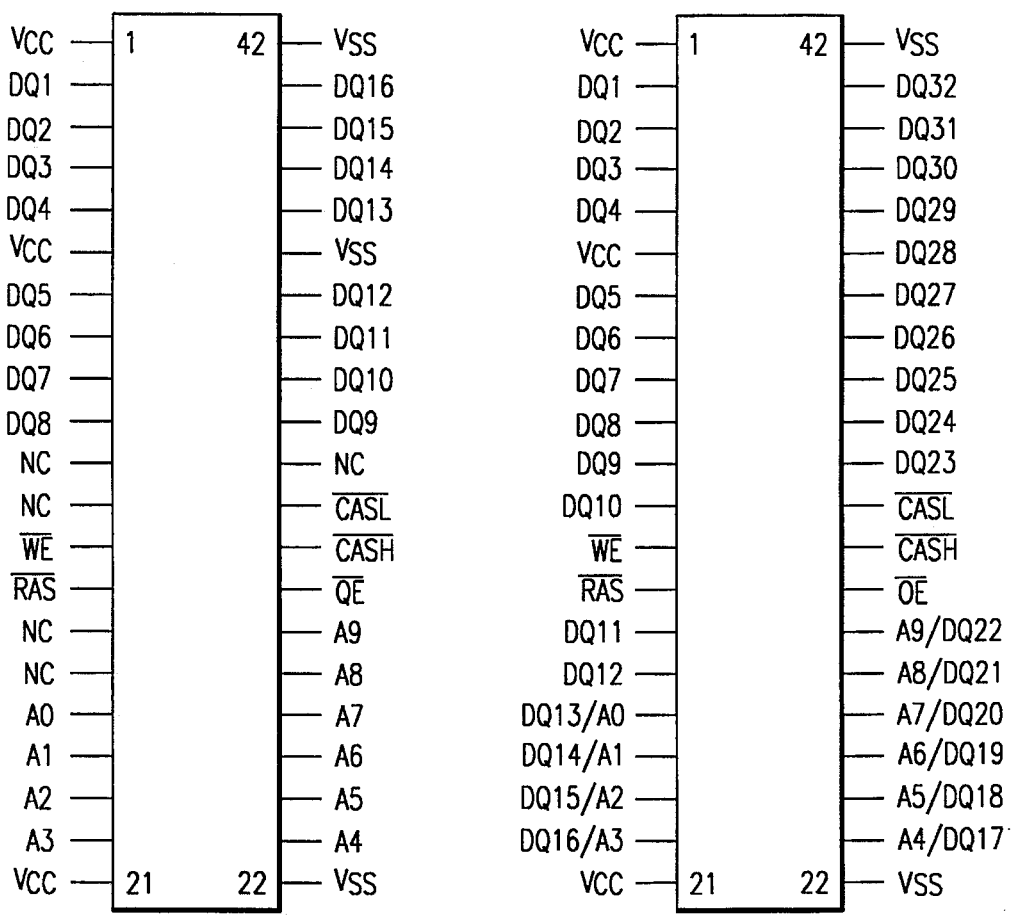
FIG. 4 is a top plan view diagram providing a side-by-side comparison of an example conventional packaged DRAM with a DRAM embodying the principles of the present invention in the same package.

FIG. 4 is a enlarged plan view of a conventional DRAM in a 42 pin SOJ package side-by-side with a DRAM embodying the present invention, also packaged in a 42 pin SOJ package. Pins labeled Ax are dedicated address pins, pins labeled DQx are dedicated data pins, and pins bearing the label Ax/DQx are multiplexed pins such as described above. Pins bearing NC are "no connect" while $\overline{RAS}$, $\overline{CASL}$, $\overline{CASH}$, $\overline{OE}$, $\overline{WE}$, $V_{cc}$ and $V_{ss}$ are all conventional control signals, clocks, and power and ground supplies known in the art. As can be seen from FIG. 4, with the conventional DRAM, the widest data port that can reasonably be packaged in a 42 pin SOJ package is 16 bits wide. In contrast, a 32-bit wide device according to the present invention can be packaged in and operate from a 42-pin SOJ package. Advantageously, the $\overline{RAS}$, $\overline{CASL}$, $\overline{CASH}$, $\overline{OE}$, $\overline{WE}$, $V_{cc}$ and $V_{ss}$ pins for both packages are identically situated, providing compatibility with the same associated printed circuit board receptacles. It should be noted that $\overline{CASL}$ and $\overline{CASH}$ in the 32-bit wide embodiment allow for the selection of 2 bytes from each 32-bit word.

Figure 5:
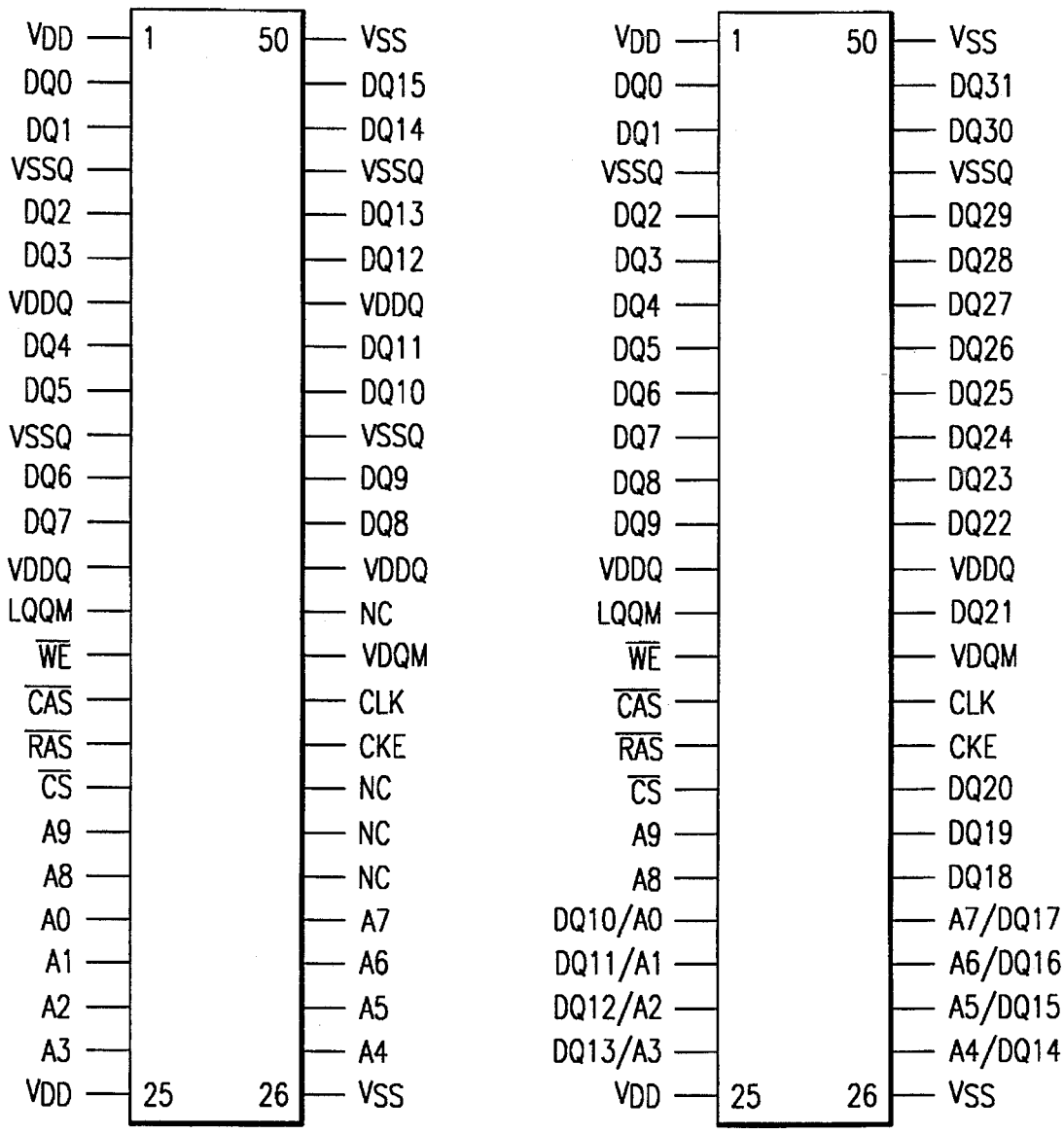
FIG. 5 is a top plan view diagram providing a side-by-side comparison of a packaged conventional SDRAM (synchronous) with an SDRAM embodying the principles of the present invention in the same package.

It should be recognized that the principles of the present invention may also be applied to page mode DRAMs and synchronous DRAMs (SDRAM). In the SDRAM embodiment, addresses and data are clocked in and pipelined to and from the cell array in response to a master clock generated off-chip in the system. In a synchronous DRAM, $\overline{RAS}$ and $\overline{CAS}$ may still be used, in this case synchronized with the master clock. A comparison between the pin-outs of a currently available SDRAM (synchronous DRAM) in a 50-pin TSOP-II package is compared with an SDRAM embodying the present invention as shown in FIG. 5. The conventional SDRAM is a 2 Mbit device arranged in 65,536 word×16-bits×2 bank architecture, with a total of only 16 pins available for data input/output. According to the present invention, 2 Mbits can be provided in the same package as 32,768 words×32-bits×2 banks, with 32 pins available for data input/output.

In a page mode operation, multiple column addresses in the same row are generated internally (or presented externally) from a single received column address. This allows multiple locations to be accessed along a selected row per each column address. In contrast, in the random access discussed above, only a single location (a column, or group of columns predefined) is accessed per $\overline{RAS}/\overline{CAS}$ cycle. It should also be noted that multiplexer 206 and input buffer/amplifier 205 may be combined into a single transceiver circuit.

Figure 6:
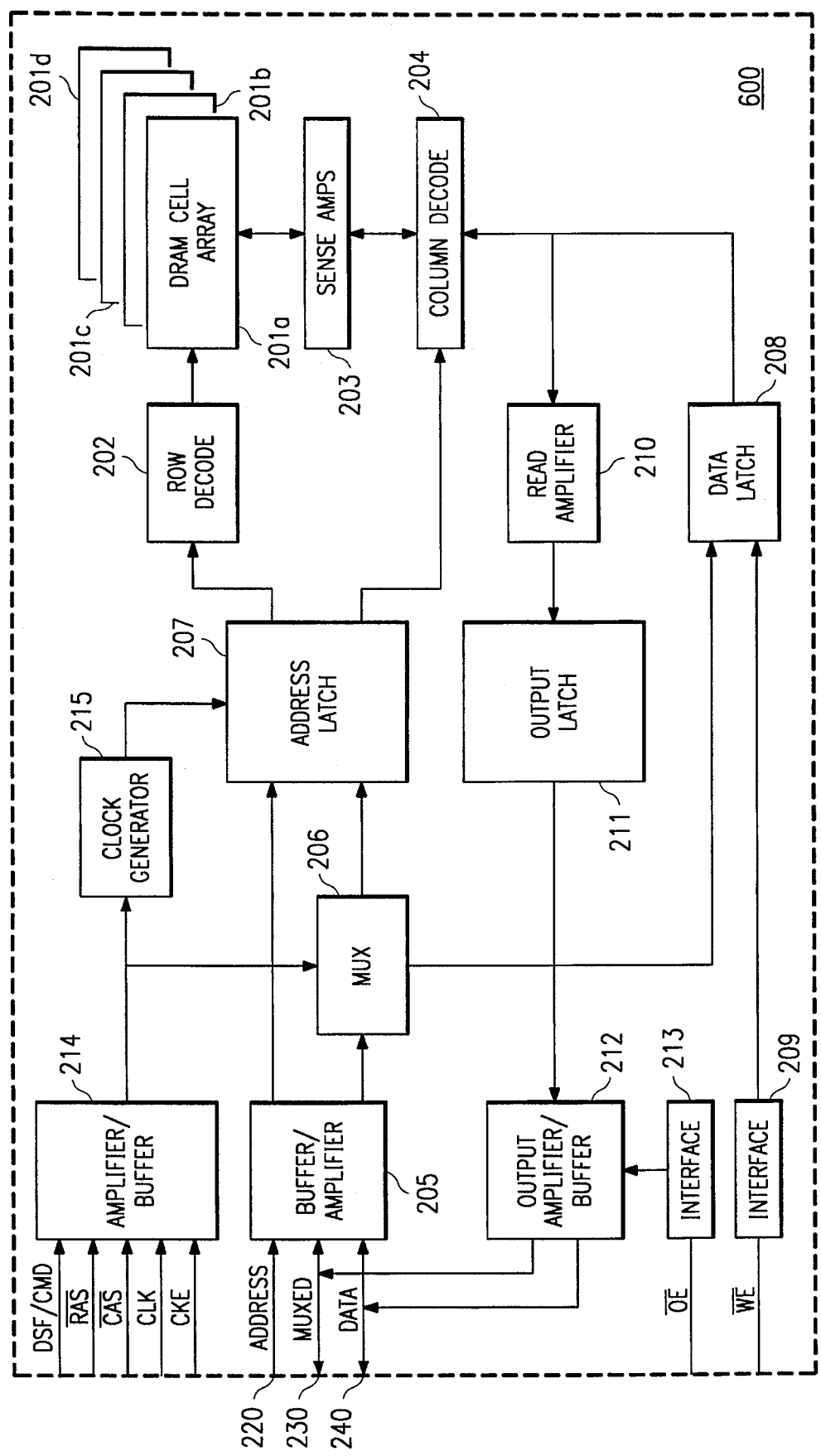
FIG. 6 is a functional block diagram of a second memory device embodying the principles of the present invention.

FIG. 6 is a functional block diagram of an exemplary 1M by 64 (64 Mbit) memory system 600 embodying the principles of the present invention. Memory system 600 is substantially similar to memory system 200, with the primary difference being that a non-multiplexed addressing scheme is used. In other words, during each random access, instead of receiving and latching-in the row address with $\overline{RAS}$ and subsequently receiving and latching-in the column address with $\overline{CAS}$, all row and column address bits are received from the associated data bus and latched-in substantially simultaneously. Since the circuitry of system 600 is substantially similar to that of system 200, for brevity and clarity, description of the common details will not be repeated here.

In system applications, such as system 100, the address bus coupled to memory 600 is appropriately configured as a "non-multiplexed" data bus in which row and column address bits are transmitted concurrently. This includes the address path between core logic 103 and system memory 105 if memory 600 is used to construct system memory 105 and/or the address path between display controler 104 and frame buffer 108, if memory 600 is used to construct frame buffer 108.

It should be recognized that non-multiplexed address provides substantial advantages at the system level. Currently, the vast majority of central processing units (CPUs) generate non-multiplexed addresses (i.e. output row and column addresses concurrently as a single word). The core logic must then multiplex the addresses by first transmitting the row address bits on the address bus along with a $\overline{RAS}$ signal to latch those row address bits through the narrow (multiplexed) address ports of the corresponding memory devices and then transmit the column address bits along with a $\overline{CAS}$ signal for latching-in those column address bits. According to the principles of the non-multiplexed embodiments of the present invention, multiplexing of addresses received by the core logic from the CPU is no longer required. Advantageously, core logic overhead can be substantially reduced. Further, if desired, addresses may be pipelined to memory directly from the CPU.

Memory system 600 is preferably a multiple bank (array) system. In the illustrated embodiment four banks are employed each of which is organized as 512 rows by 512 columns of 64 bits (i.e. 512×512×64). In alternate embodiments, the row and column organizations may vary as a design choice. In memory system 600, nine column address bits A0–A8 are input through a corresponding nine dedicated address pins 220 to access 1 out of 512 columns. Nine row address bits A9–A17 are input to select 1 out of 512 rows along with two bank select bits A18–A19 for selecting one out of four banks 201 through eleven corresponding multiplexed address/data pins 230.

In the depiction of FIG. 6, system 600 is shown with terminals for a master clock CLK, clock enable CKE signal design special function DSF, and a command bit (CMD) for synchronous operation. In asynchronous embodiments, these pins (signals) are not necessarily required; timing in the asynchronous case is based on traditional $\overline{RAS}$ and $\overline{CAS}$ signals.

Figure 7A:
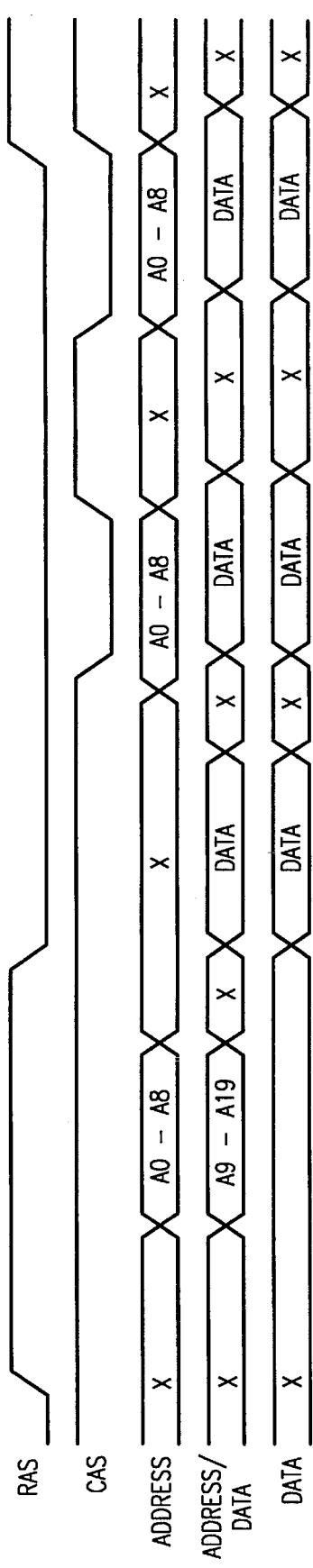
FIGS. 7A and 7B are timing diagrams illustrating selected operating cycles of methods of operating memory devices according to the principles of the present invention.

FIG. 7A is a timing diagram illustrating addressing in an asynchronous configuration of memory 600 (the time base is not to scale.) Generally, the addressing of each random access uses "non-multiplexed addresses" in which the row and column address bits are presented simultaneously (multiplexing of data pins 230 is still performed). During the precharge period when $\overline{RAS}$ is high, all 20 row, column and bank select bits are latched-in through dedicated address pins 220 and multiplexed address pins 230. When $\overline{RAS}$ transitions to a logic low state, memory 600 enters an active cycle. After a short set-up period, a random access (read or write) to the addressed 64-bit word is made. During a read, data is output at both multiplexed pins 230 and dedicated data pins 240 by output buffer 205. During a write, 64-bits presented at multiplexed pins 230 and dedicated data pins 240 are passed through multiplexer 206 to data latch 208. For the random access, $\overline{CAS}$ is not required. In the preferred embodiment, $\overline{RAS}$ acts not only as a row address strobe but also as a master clock, which among other things, activates the column decoder circuitry 204. This is in contrast to traditional DRAMs in which column decoder activation is controlled by $\overline{CAS}$.

In the illustrated embodiment, $\overline{CAS}$ is used for page accesses along the same row and bank selected by the row and bank address bits for the initial (random) access. As shown in FIG. 7A, when $\overline{CAS}$ transitions low after the random access, additional column address bits presented at the dedicated address pins 220 are latched-in and decoded. The row address inputs are either in a don't care state or in the case of multiplexed data/address pins 230, simply remain in the data access state. After a short delay for set-up, 64-bits are accessed through the multiplexed pins 230 and the dedicated data pins 240. $\overline{CAS}$ then returns to a logic high state ($\overline{RAS}$ remains low until the desired number of page accesses has been made). On the next transition of $\overline{CAS}$ to a logic low, the column address bits for the next page are presented at address pins 220 and shortly thereafter the access is made through multiplexed pins 230 and data pins 240. Additional pages along the selected row in the selected bank are performed in a similar fashion, with the number of pages capable of being accessed depending on such factors as the number of pages per row and the amount of time memory 600 can remain in the active state (i.e. with RAS low).

Figure 7B:
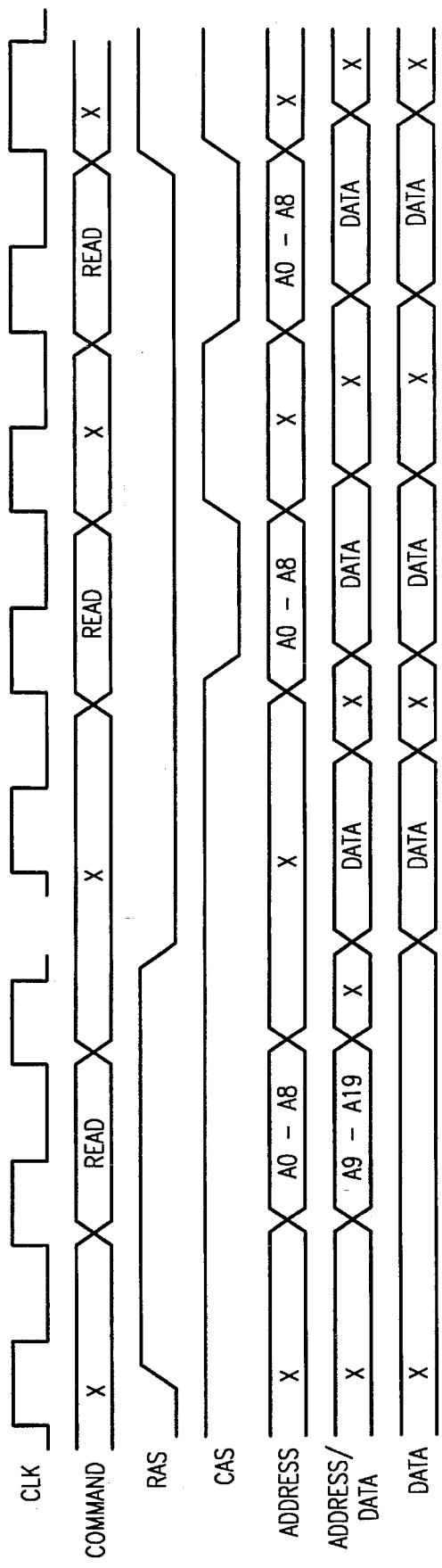

FIG. 7B illustrates non-multiplexed addressing when memory 600 is configured as a synchronous DRAM. In this case, timing is controlled by the master clock CLK and an additional command signals DSF and CMD (together designated COMMAND for discussion purposes). For illustrative purposes, a read access is shown, although write accesses are similar. In the synchronous DRAM embodiment, data accesses are triggered off the master clock CLK rather than RAS or CAS.

Advantageously, in both the synchronous and asynchronous cases, and for at least the random accesses, the column address is decoded and column decoder circuitry 204 configured prior to the trigger signal (the falling edge of $\overline{RAS}$ in the asynchronous case of FIG. 7A or a given master clock edge in the synchronous case of FIG. 7B) o This feature reduces the latency time between presentation of the address and the access to the addressed location once the triggering signal arrives. In conventional DRAMs the column address is decoded and the column decoder configured only after the triggering signal has been received.

Figure 8:
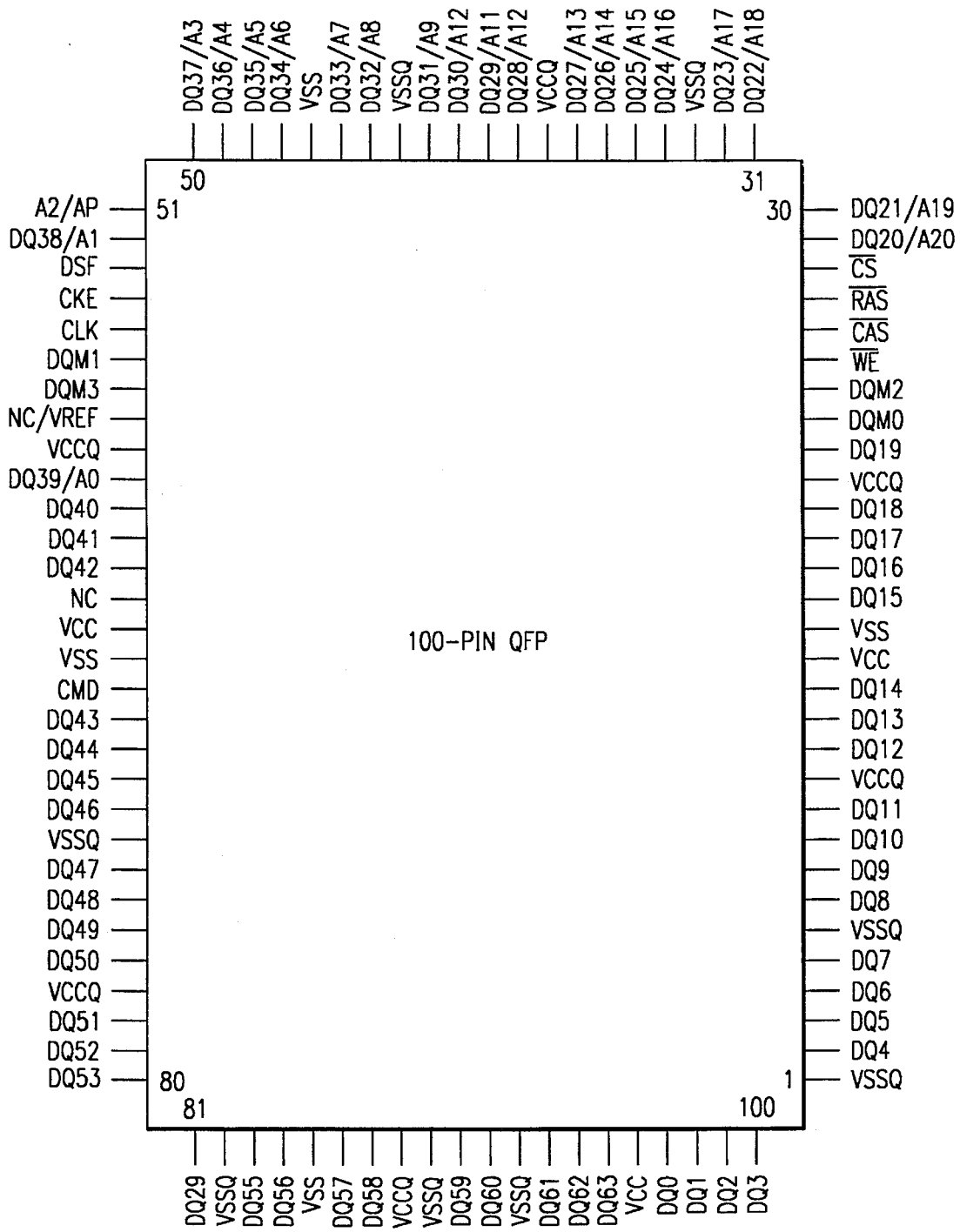
FIG. 8 is a top plan view diagram of a preferred packaging arrangement suitable for packaging a wide data port device such as that depicted in FIG. 6.

FIG. 8 is a top plan view of a packaged 64-bit wide data port synchronous DRAM with non-multiplexed addressing according to the principles of the present invention. In the embodiment of FIG. 6, 44 pins are dedicated data pins (DQx) and 20 pins are multiplexed data/address pins (DQx/Ay). In this embodiment, no dedicated address pins are used for further efficiency. The operation of the device of FIG. 8 is essentially the same as that shown in FIG. 7B with the exception that during page mode operations, the multiplexed address/data pins used for receiving column (page) addresses switch (cycle) between the address bus and the data bus as each page is addressed and subsequently accessed.

FIG. 8 also depicts each of the power and control pins normally required of a synchronous DRAM. Pins are provided for power (Vcc and Vss), data I/O buffer power (VccQ and VssQ), DSF or "design special function", command (CMD), $\overline{RAS}$, $\overline{CAS}$, write enable (WE), chip select (CS), master clock (CLK), clock enable (CKE), and write mask enable (DQM0–DQM3). It alternate embodiments, the pinouts and/or packaging may vary as required to meet the requirements of a given application.

Although the present invention and its advantages have been described in detail, it should be understood that various changes, substitutions and alterations can be made herein without departing from the spirit and scope of the invention as defined by the appended claims.

What is claimed is:

1. A method of operating a memory device including a plurality of multiplexed data/address input/output terminals, an array of memory cells, and circuitry for accessing selected ones of the memory cells in response to received row and column address bits, the method comprising the steps of:

substantially simultaneously inputting said row address bit and column address bit during an address cycle, at least one of said row and column address bits input through a selected one of the multiplexed terminals; and accessing ones of the memory cells addressed by the row and column bits through selected ones of the multiplexed terminals during a data access cycle.

2. The method of claim 1 and further comprising the step of inputting an additional column address bit to access at least one additional cell along a row addressed by the row address bit.

3. The method of claim 2 wherein the memory device further comprises at least one dedicated address terminal and wherein said step of inputting an additional column address bit comprises the step of inputting the additional column address bit through the dedicated address terminal.

4. The method of claim 1 wherein the memory device is controlled by a row address strobe and the address cycle occurs during a period when the row address strobe is in a logic high state and the data access cycle occurs during a period when the row address strobe is in a logic low state.

5. The method of claim 3 wherein the at least one additional column address bit is input in response to a column address strobe.

6. The method of claim 5 wherein the least one additional column address bit is input during the period when the row address strobe is in a logic low state.

7. The method of claim 1 wherein the memory device comprises a synchronous memory device and the method further comprises the step of inputting command information during the address cycle.

8. A method of operating a random access memory comprising the steps of:

during a precharge period, substantially simultaneously inputting row and column address bits, at least some of said row and column address bits input through a plurality of multiplexed data/address input/output terminals; and during an active period, performing a random access to memory cells addressed by the input row and column address bits through the multiplexed terminals.

9. The method of claim 8 wherein a row address strobe times the precharge and active periods, the row address strobe being in a first logic state during the precharge period and in a second logic state during the active period.

10. The method of claim 8 and further comprising the step of performing a page access following the random access, said step of performing a page access comprising the substeps of:

inputting a plurality of additional column address bits in response to a column address strobe transitioning from a first logic state to a second logic state; and accessing a page addressed by the additional column address bits from the row addressed during the precharge cycle.

11. The method of claim 10 wherein the memory includes dedicated address terminals and said step of inputting additional column address bits comprises the step of inputting at least some of the additional column address bits through the dedicated address terminals.

12. The method of claim 8 and further comprising the step of decoding the column address bits received during the precharge period during the precharge period.

13. The method of claim 8 wherein the memory comprises a synchronous memory and the method further comprises the step of inputting at least one command bit during the precharge period.

14. The method of claim 10 wherein said step of performing a page access further includes the substep of inputting at least one command bit identifying a type of access being performed.

15. A random access memory comprising:

a plurality of terminals for receiving substantially simultaneously row and column address bits during an address cycle, at least some of said plurality of terminals comprising multiplexed terminals for exchanging data during a data access cycle;

an array of rows and columns of memory cells; and addressing circuitry for accessing locations within said array in response to received row and column address bits.

16. The memory system of claim 15 wherein said terminals comprise pins.

17. The memory system of claim 15 wherein said random access memory comprises a synchronous dynamic random access memory.

18. The memory system of claim 15 and wherein said plurality of terminals includes at least one dedicated data terminal for exchanging data with an external device.

19. The memory system of claim 15 and wherein said plurality of terminals includes at least one dedicated address terminal for receiving an address bit an external device.

20. The memory system of claim 19 wherein said at least one dedicated address pins comprises at least one column address pin.

21. A memory system comprising:

a non-multiplexed address bus;

a data bus; and a random access memory comprising:

a plurality of terminals for receiving substantially simultaneously row and column address bits presented on said non-multiplexed address bus during an address cycle, at least some of said plurality of terminals comprising multiplexed terminals for exchanging data with said data bus during a data access cycle;

an array of rows and columns of memory cells; and addressing circuitry for accessing locations within said array during said data access cycle in response to received row and column address bits.

22. The system of claim 21 wherein said random access memory comprises a synchronous dynamic random access memory.

23. The system of claim 21 where in said random access memory comprises an asynchronous dynamic random access memory.

* * * * *